United States Patent
Chandrasekaran

(10) Patent No.: US 9,252,128 B2
(45) Date of Patent: Feb. 2, 2016

(54) PANELIZED BACKSIDE PROCESSING FOR THIN SEMICONDUCTORS

(75) Inventor: Arvind Chandrasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 918 days.

(21) Appl. No.: 13/282,712

(22) Filed: Oct. 27, 2011

(65) Prior Publication Data

US 2012/0040497 A1 Feb. 16, 2012

Related U.S. Application Data

(62) Division of application No. 12/437,168, filed on May 7, 2009, now Pat. No. 8,294,280.

(51) Int. Cl.
*H01L 21/44* (2006.01)
*H01L 25/065* (2006.01)
*H01L 21/768* (2006.01)

(52) U.S. Cl.
CPC ...... *H01L 25/0657* (2013.01); *H01L 21/76898* (2013.01); *H01L 2224/16* (2013.01); *H01L 2225/06517* (2013.01); *H01L 2225/06541* (2013.01); *H01L 2225/06572* (2013.01); *H01L 2924/01078* (2013.01); *H01L 2924/18161* (2013.01)

(58) Field of Classification Search
CPC ........... H01L 2924/01079; H01L 2924/01078; H01L 2924/01013; H01L 2924/01029; H01L 2924/14; H01L 21/76898; H01L 25/0657; H01L 2225/06572; H01L 2224/16; H01L 2924/18161

USPC .................. 438/107–109, 613, 460, 459, 477; 257/686

See application file for complete search history.

(56) References Cited

U.S. PATENT DOCUMENTS

| | | | |
|---|---|---|---|
| 6,870,248 B1 * | 3/2005 | Shibata | 257/686 |
| 8,035,207 B2 * | 10/2011 | Camacho et al. | 257/678 |
| 8,294,280 B2 | 10/2012 | Chandrasekaran | |
| 2004/0113275 A1 | 6/2004 | Karnezos | |
| 2004/0115867 A1 | 6/2004 | Shibata | |
| 2005/0146056 A1 | 7/2005 | Shibata | |

(Continued)

FOREIGN PATENT DOCUMENTS

| | | |
|---|---|---|
| CN | 1976014 A | 6/2007 |
| EP | 1775768 A1 | 4/2007 |

(Continued)

OTHER PUBLICATIONS

Chandrasekaran, et al., "Variable feature Interface That allows a balanced Stress to prevent Thin Die Warpage" U.S. Appl. No. 12/540,586, filed Aug. 13, 2009, 31 pages.

(Continued)

*Primary Examiner* — Hoa B Trinh
(74) *Attorney, Agent, or Firm* — Donald D. Min

(57) ABSTRACT

A semiconductor manufacturing method includes attaching a first die to a substrate panel. The method also includes applying a mold compound after attaching the first die to the substrate panel to the first die and the substrate panel. The method further includes thinning the first die and the mold compound after applying the mold compound. Attaching the die to the substrate panel before thinning eliminates usage of a carrier wafer when processing thin semiconductors.

17 Claims, 15 Drawing Sheets

(56) References Cited

U.S. PATENT DOCUMENTS

| | | | |
|---|---|---|---|
| 2007/0126085 A1 | 6/2007 | Kawano et al. | |
| 2009/0160065 A1 | 6/2009 | Haba et al. | |
| 2010/0109169 A1* | 5/2010 | Kolan et al. | 257/787 |

FOREIGN PATENT DOCUMENTS

| | | |
|---|---|---|
| JP | 2001057404 A | 2/2001 |
| JP | 2001144218 A | 5/2001 |
| JP | 2002348697 A | 12/2002 |
| JP | 2003142648 A | 5/2003 |
| JP | 2004158537 A | 6/2004 |
| JP | 2005340389 A | 12/2005 |
| JP | 2006216691 A | 8/2006 |
| JP | 2007180529 A | 7/2007 |
| JP | 2007317822 A | 12/2007 |
| JP | 2008177504 A | 7/2008 |
| KR | 20080068334 | 7/2008 |
| WO | 2005119776 A1 | 12/2005 |

OTHER PUBLICATIONS

Chandrasekeran, et al., "Discontinuous Thin Semi conductor wafer surface features" U.S. Appl. No. 12/437,111, filed May 7, 2009. 26 Pages.

Gu, et al., "Stress Balance layer on Semi-conductor Wafer backside", U.S. Appl. No. 12/463,759, filed Jun. 12, 2009. 42 Pages.

International Search Report and Written Opinion—PCT/US2010/034096, International Search Authority—European Patent Office—Aug. 13, 2010.

Taiwan Search Report—TW099114816—TIPO—Feb. 22, 2013.

* cited by examiner

PANELIZED BACKSIDE PROCESSING FOR THIN SEMICONDUCTORS

CROSS REFERENCE TO RELATED APPLICATION

This application is a divisional application of co-pending U.S. patent application Ser. No. 12/437,168 filed May 7, 2009, entitled "PANELIZED BACKSIDE PROCESSING FOR THIN SEMICONDUCTORS."

TECHNICAL FIELD

The present disclosure generally relates to integrated circuits (ICs). More specifically, the present disclosure relates to manufacturing integrated circuits.

BACKGROUND

Semiconductor dies include collections of transistors and other components in an active layer fabricated on substrates. Commonly, these substrates are semiconductor materials, and, in particular, silicon. Additionally, these substrates are conventionally thicker than necessary to obtain desirable device behavior. Conventionally, the layers are deposited on semiconductor wafers that are cingulated or diced to form semiconductor dies.

Thick substrates have advantages during semiconductor manufacturing outside of transistor behavior. During manufacturing of wafers and/or dies, a substrate endures dozens of processes, high temperatures, and transfers between tools or even fabrication sites. During these transfers the substrate can break, resulting in a loss of time and resources. Thick substrates are less likely to break during manufacturing.

Materials deposited on the substrate may have a different stress than the substrate resulting in unbalanced stress. When the stress between the substrate and deposited materials is unbalanced, the substrate may warp or bend to reach an equilibrium stress. Thick substrates are able to counterbalance the stress imposed by deposited materials better than thin substrates. Problems with using thin substrates during manufacturing have conventionally been solved by attaching the thin substrate to a thick support substrate by adhesives. The support substrate is referred to as a carrier wafer. The carrier wafer is detached after completion of the portions of the manufacturing process during which the thin substrate is at risk of fracturing.

Use of a carrier wafer is undesirable for several reasons. The carrier wafer adds cost to manufacturing but does not add tangible value to the final product. Additionally, the adhesives that attach the carrier wafer to the thin substrate leave residue on the thin substrate of the semiconductor wafer. Although the carrier wafer provides stability during manufacturing, releasing the thin substrate from the carrier wafer represents a manufacturing challenge.

One example of manufacturing using a thin substrate is construction of stacked ICs. Stacked ICs increase device functionality and decrease die size by stacking dies vertically. Similar to high-rise towers that fit more office space in a smaller land area, stacked ICs offer more space for transistors and other components while occupying the same area.

In stacked ICs, a second die is stacked on a first die allowing construction to expand into three dimensions (3D). Stacked ICs allow products with a greater number of components to fit in small form factors. Component density of a semiconductor die is number of components in the die divided by the die area. For example, stacking a die on an identical die results in approximately double the number of components in the same area to double component density. When a second die is stacked on a first die, the two dies share the same packaging and communicate to external devices through the packaging.

Conventionally, the second die is coupled to packaging and external devices with through silicon vias located in the first die. Through silicon vias are limited in aspect ratio based, in part, on the manufacturing technique selected. As a result, the height of the first die is limited in order to ensure the through silicon via may extend the entire height of the first die. The through silicon via should extend the entire height to obtain a conducting path from a packaging substrate to the second die. As the height of the first die decreases to accommodate the through silicon via manufacturing, the first die loses structural strength.

Manufacturing a stacked IC conventionally includes attaching a first die to a carrier wafer for support before thinning the first dies. The first dies is then thinned to accommodate the height of the through silicon vias. The wafer of the first dies should be released from the carrier wafer after thinning to package the stacked IC. However, once released from the carrier wafer, the first die may have an unbalanced stress between the substrates of the first dies and any active layers in the dies.

Thus, there is a need for semiconductor manufacturing of thin substrates that reduces risk to the thin substrates without using a carrier wafer.

BRIEF SUMMARY

According to one aspect of the disclosure, a semiconductor manufacturing method includes attaching a first die to a substrate panel. The method also includes applying a mold compound after attaching the first die to the substrate panel to the first die and the substrate panel. The method further includes thinning the first die and the mold compound after applying the mold compound.

According to another aspect of the disclosure, a semiconductor manufacturing method includes dicing a wafer into a first tier die. The method also includes attaching the first tier die to a substrate panel. The method further includes applying a first mold compound to the first tier die and the substrate panel. The method also includes backgrinding the first tier die and the first mold compound. The method yet also includes attaching a second tier die to the first tier die. The method further includes applying a second mold compound to the first tier die and the second tier die.

According to yet another aspect of the disclosure, a semiconductor device includes a substrate panel. The device also includes a first die attached on the substrate panel. The device further includes a molding compound partially surrounding the first die and flush with the substrate panel.

According to a further aspect of the disclosure, a semiconductor device includes means for electronic processing. The device also includes means for fixing in place the means for electronic processing. The device further includes means for packaging the means for electronic processing flush with the means for fixing and the means for electronic processing.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
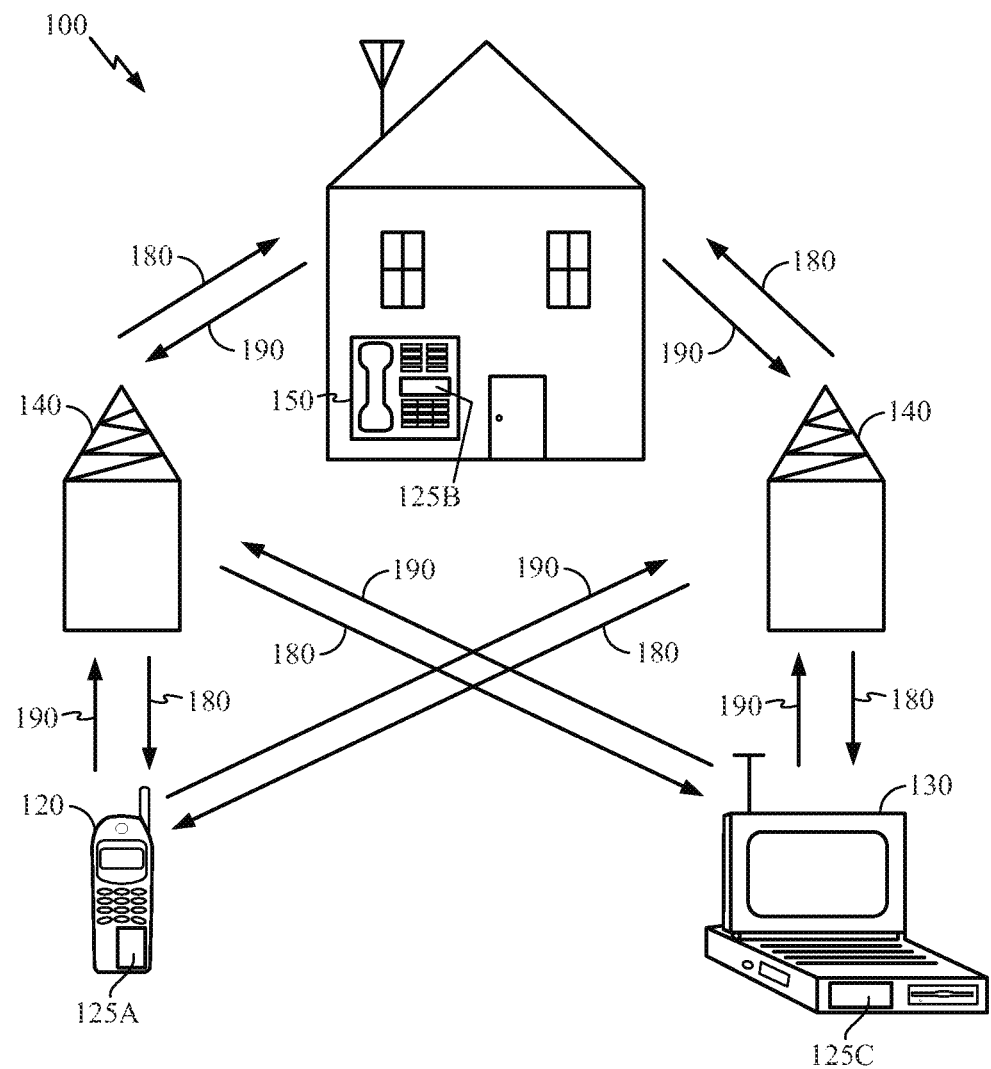
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include IC devices 125A, 125B and 125C that include circuitry manufactured by the processes disclosed, here. It will be recognized that any device containing an IC may also include semiconductor components having the disclosed features and/or components manufactured by the processes disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 1 illustrates remote units according to the teachings of the disclosure, the disclosure is not limited to these exemplary illustrated units. The disclosure may be suitably employed in any device, which includes semiconductor components, as described below.

Figure 2:
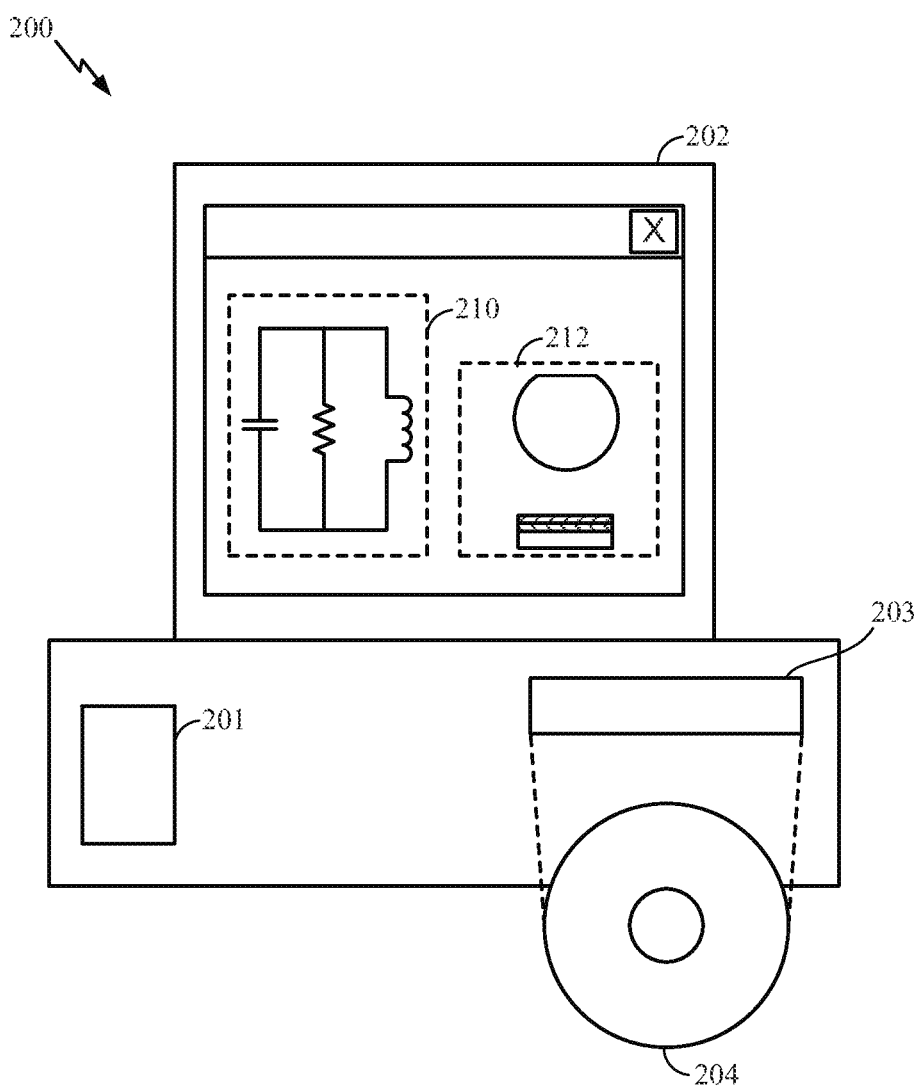
FIG. 2 is a block diagram illustrating a design workstation used for circuit, layout, and logic design of a semiconductor component as disclosed below.

FIG. 2 is a block diagram illustrating a design workstation used for circuit, layout, and logic design of a semiconductor component as disclosed below. A design workstation 200 includes a hard disk 201 containing operating system software, support files, and design software such as Cadence or OrCAD. The design workstation 200 also includes a display to facilitate design of a circuit 210 or a semiconductor component 212 such as a wafer or die. A storage medium 204 is provided for tangibly storing the circuit design 210 or the semiconductor component 212. The circuit design 210 or the semiconductor component 212 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit design 210 or the semiconductor component 212 by decreasing the number of processes for designing semiconductor wafers.

Figure 3:
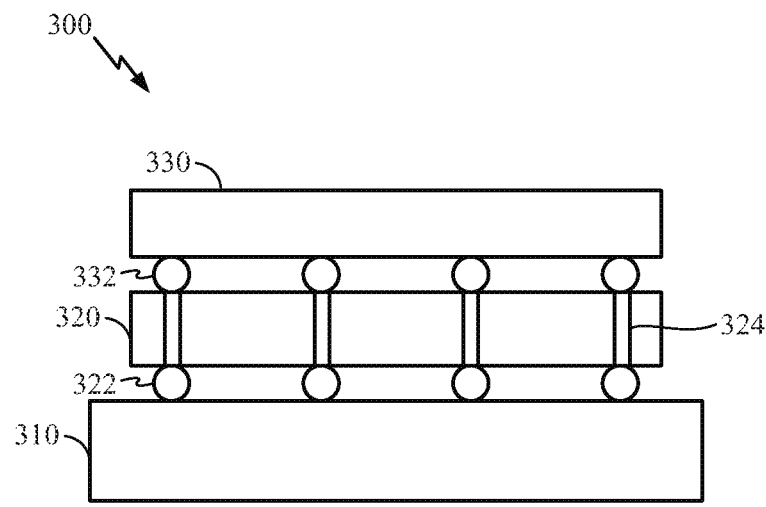
FIG. 3 is a block diagram illustrating a stacked IC.

FIG. 3 is a block diagram illustrating a stacked IC. A stacked IC 300 includes a packaging substrate 310. The packaging substrate 310 is coupled to a first tier die 320 through a packaging connection 322 such as bumps in a ball grid array. Alternatively, pins or other suitable packaging connections may be used. A second tier die 330 is coupled to the first tier die 320 through a packaging connection 332 such as bumps in a ball grid array. The first tier die 320 includes through silicon vias 324. The through silicon vias 324 extend the entire height of the first tier die 320 and couple the packaging substrate 310 to the packaging connection 332 to allow communication from the packaging substrate 310 to the first tier die 320 or the second tier die 330. Additional dies (not shown) may be stacked further on top of the second tier die 330.

Stacked ICs, such as the stacked IC 300, allow manufacturing of higher density ICs through 3D stacking than could be achieved on a 2D IC. For example, the second tier die 330 may be a memory or cache device, and the first tier die 320 may be a processor or other logic circuitry. A large portion of a microprocessor's die area is occupied by L2 cache. Stacking the cache on the logic circuitry may reduce the die size of the microprocessor. Alternatively, DRAM components, located on dies separate from a microprocessor may be stacked on the microprocessor. Stacking DRAM components on a microprocessor may reduce space constraints on a motherboard. Additionally, locating DRAM components closer to the microprocessor may reduce latency and allow use of methods that increase bandwidth to the DRAM components, such as higher clock rates. For at least these reasons, higher densities of components achievable using stacked ICs are expected to support development of future ICs.

When the second tier die 330 is attached to the first tier die 320, damage may occur as a result of the physical force placed on the first tier die 320. The thickness of the first tier die 320 corresponds to its mechanical strength to withstand these physical forces. Thus, when the first tier die 320 is thinned to expose the through silicon vias 324, damage is more likely to occur to the first tier die 320 during attachment of the second tier die 330.

Figure 4:
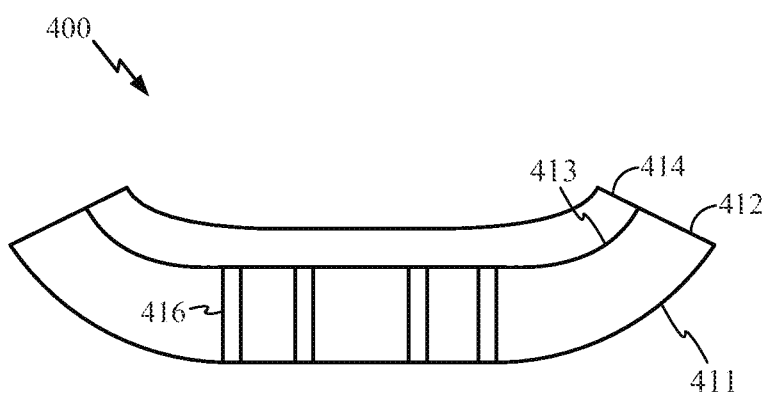
FIG. 4 is a block diagram illustrating a die under tensile stress.

FIG. 4 is a block diagram illustrating a die under tensile stress. A die 400 has a substrate 412 and an active layer 414. The substrate 412 may be, for example, silicon or other semiconductor materials. The active layer 414 may include components such as, for example, transistors. The active layer 414 may also include interconnects and vias to couple the components to external devices (not shown). Through silicon vias 416 are located in the substrate 412 to allow coupling between a front side 413 of the substrate 412 and a back side 411 of the substrate 412. For example, the die 400 may be a first tier in a stacked IC mounted on a packaging substrate (not shown). In this case, the through silicon vias 416 may couple a second tier of the stacked IC to the packaging substrate.

The through silicon vias 416 are formed with etching techniques such as, for example, reactive ion etching, wet etching, or laser drilling. The height of the through silicon vias 416 is limited and determined, in part, by the width of the through silicon vias 416. For example, an etch process may have an etch ratio of 10:1, indicating the etch may only proceed ten times as deep as the through silicon vias 416 are wide. In this case, a 1 µm through silicon via may be etched 10 µm deep. Thus, the height of the substrate 412 should be smaller than that allowed by the selected etching process and the width of the through silicon vias 416.

The mechanical strength of the substrate 412 is proportional to the height of the substrate 412. Thus, reducing the height of the substrate 412 to allow the through silicon vias 416 to extend from the front side 413 to the back side 411 reduces the mechanical strength of the substrate 412. The active layer 414 remains a fixed height during thinning of the substrate 412. Thus, the substrate 412 has less strength to support the same level of stresses built up in the active layer 414 regardless of the height of the substrate 412. Stresses in the active layer 414 can be residual compressive or residual tensile depending on the number and type of films of which the active layer 414 is composed. If there is a net residual compressive stress on the substrate 412, the substrate 412 will tend to push outwards and the entire assembly will bend in a frown shape. If there is a net residual tensile stress on the substrate 412, the substrate 412 will tend to push inwards and the entire assembly will bend in a smile shape.

Further, temperature may affect the stress in the active layer 414 and the substrate 412. For example, as temperature rises the different materials may expand at different rates. If the active layer 414 expands at a faster rate than the substrate 412, the substrate 412 may warp due to lack of mechanical strength. Warpage may damage devices in the active layer 414 or cause problems later in manufacturing.

Additionally, components in the active layer 414 are designed to function properly in specific stress ranges. For example, tensile stress in the active layer 414 improves carrier mobility in nFET devices.

In addition to built-up stress in the active layer 414, manufacturing processes damage the front side 413 of the substrate 412. Damage is caused by impact of energetic particles on the substrate 412 during plasma processes such as reactive ion etch and metal deposition. The damage may also be caused by exposure to chemicals used during wet etch or cleaning. When the front side 413 of the substrate 412 is damaged, the stress of the damaged portion is different from the bulk of the substrate 412. These differences in stress lead to additional warpage problems in manufacturing.

Figure 5:
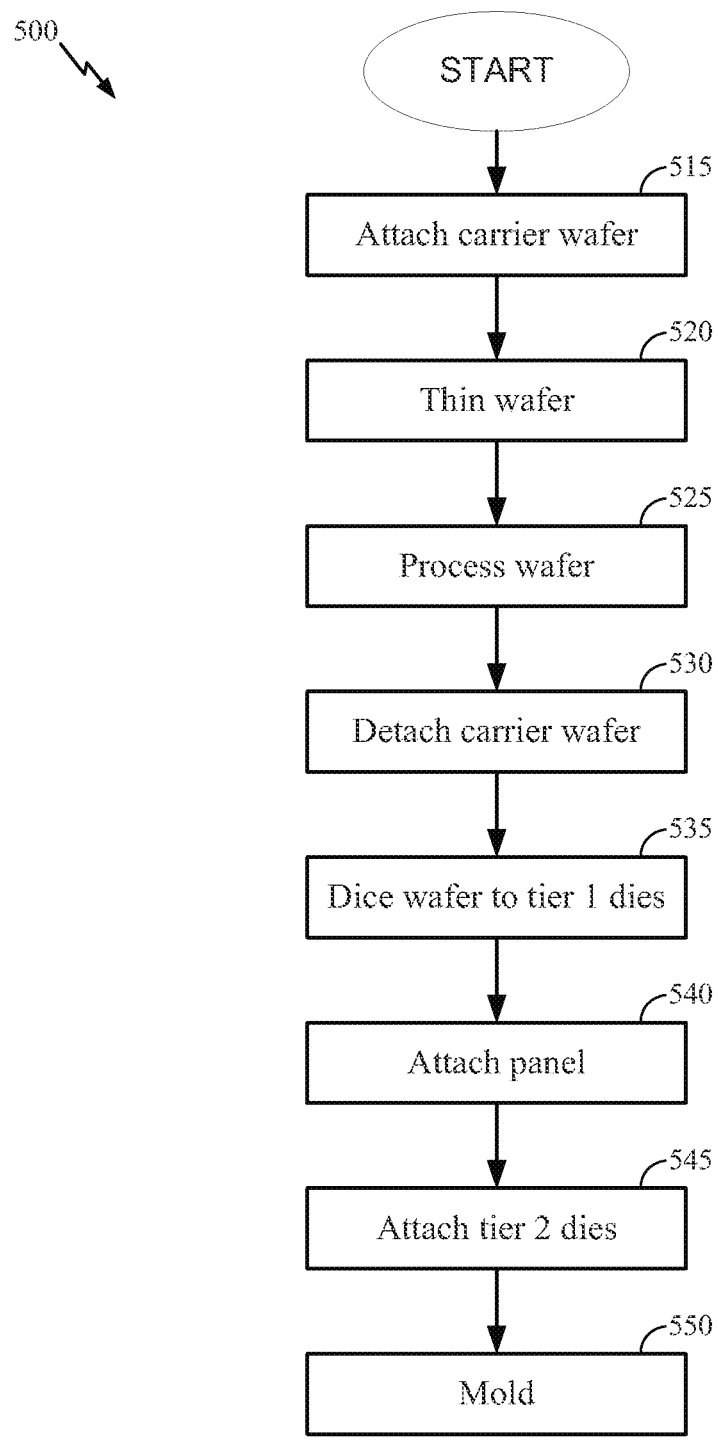
FIG. 5 is a flow chart illustrating conventional stacked IC manufacturing.

FIG. 5 is a flow chart illustrating conventional stacked IC manufacturing. At block 515, the wafer is attached to a carrier wafer. The carrier wafer provides support for the wafer during manufacturing. At block 520, the wafer is thinned to expose a through silicon via. At block 525, the wafer is processed. Exemplary processes include deposition of active layers, manufacturing transistor contacts, and manufacturing transistor interconnects. After the wafer is thinned and active layers deposited, warpage may occur due to unbalanced stress in the wafer. The carrier wafer provides additional support to prevent warpage after thinning. At block 530, the carrier wafer is detached from the wafer. Detaching the carrier wafer includes dissolving adhesive and cleaning the wafer of adhesive residue. The residue is difficult to completely remove, and cleaning uses harsh chemicals that may damage the wafer.

At block 535, the wafer is diced into individual first tier dies. At block 540, the first tier die is attached to a substrate panel. At block 545, a second tier die is attached on the first tier die. At block 550, the first tier die, second tier die, and substrate panel are molded together. Additional manufacturing may be completed after block 550 including marking and attaching packaging connections such as a ball grid. Conventional stacked IC manufacturing is explained in more detail below with reference to FIG. 6.

Figure 6A:
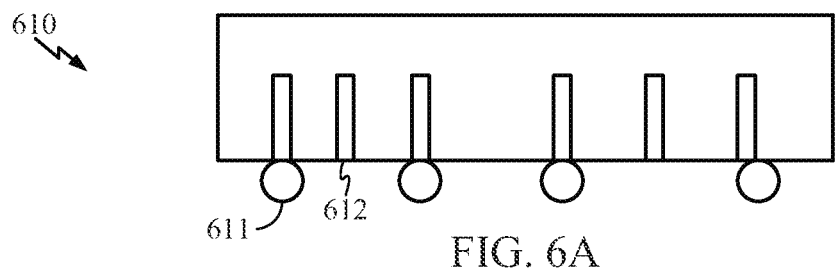
FIGS. 6A-6K are block diagrams illustrating a conventional stacked IC manufacturing process.
Figure 6B:
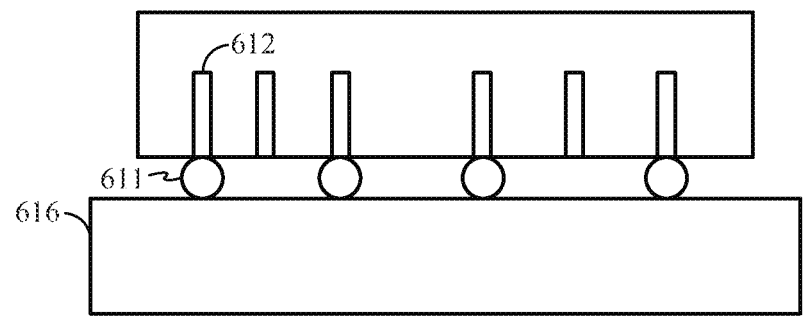

FIGS. 6A-6K are block diagrams illustrating conventional stacked IC manufacturing. FIG. 6A includes a wafer 610 having through silicon vias 612 and a packaging connection 611. The wafer 610 is attached on a carrier wafer 616 in FIG. 6B. The carrier wafer 616 provides additional support for the wafer 610 during thinning and subsequent manufacturing processes. If no support is provided, the wafer 610 may warp as described above with reference to FIG. 4. The carrier wafer 616 consumes additional materials and resources that are not a part of a final product. Thus, the carrier wafer 616 adds to manufacturing cost but provides no tangible benefit in the end product. Additionally, the carrier wafer 616 may be removed later in manufacturing, adding to the length of manufacturing. After attachment to the carrier wafer 616, the wafer 610 may be thinned with a decreased likelihood of warpage.

Figure 6C:
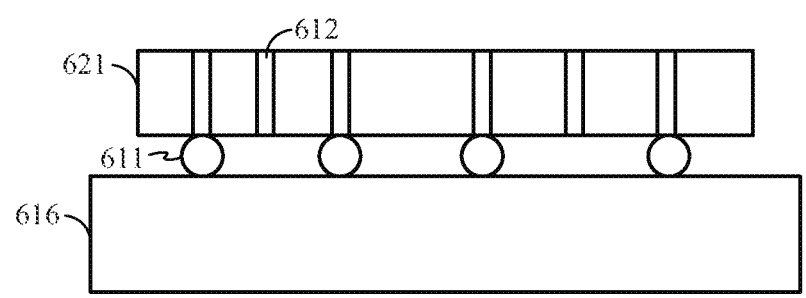
Figure 6D:
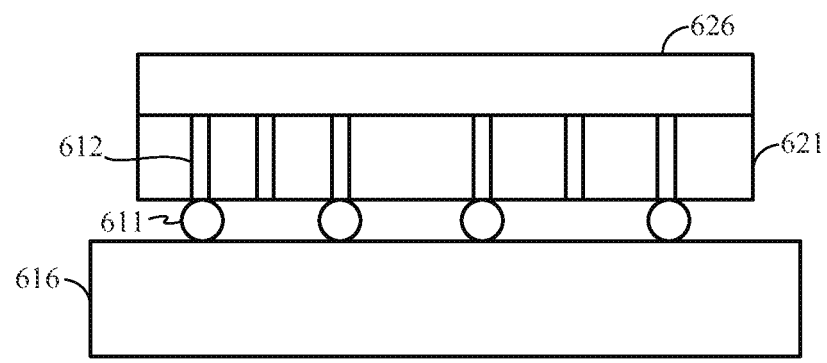
Figure 6E:
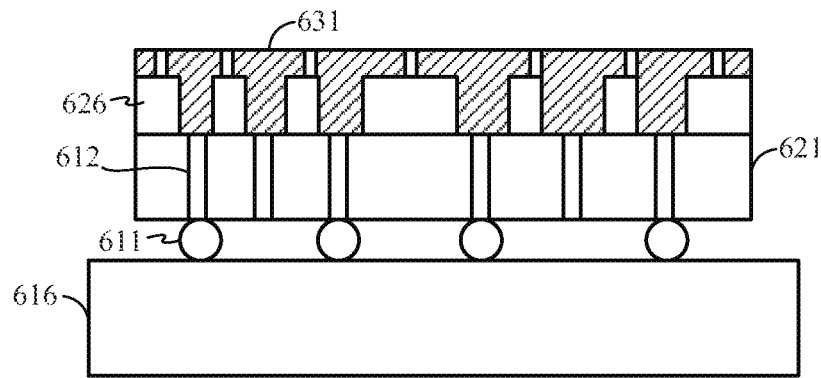
Figure 6F:
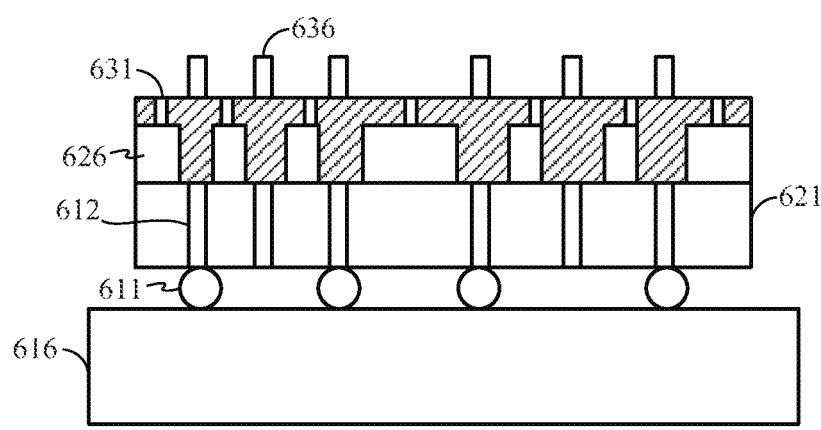
Figure 6G:
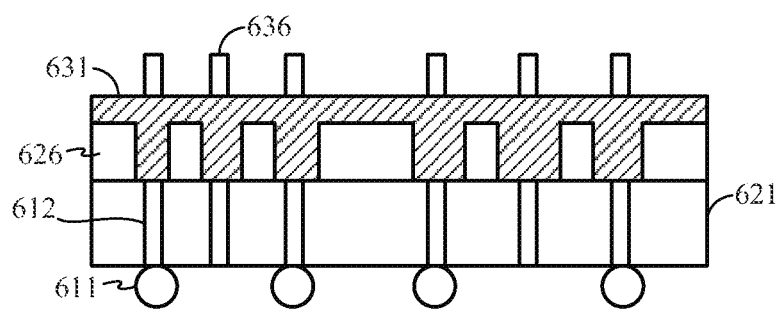
Figure 6H:
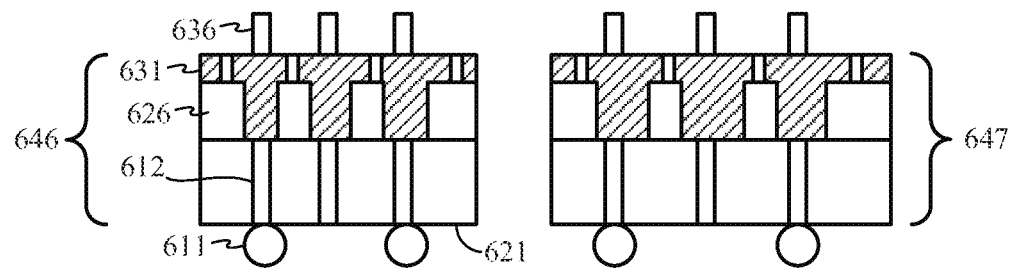
Figure 6I:
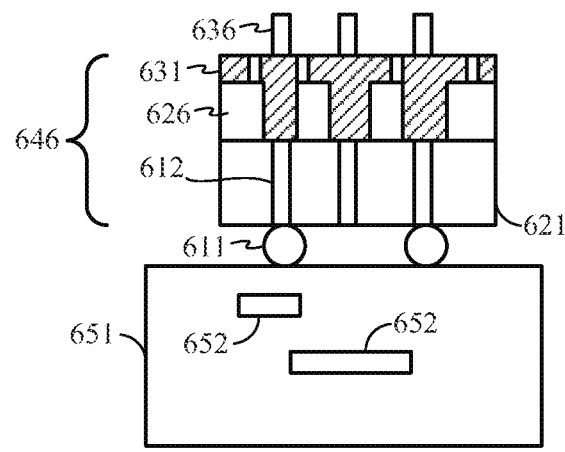
Figure 6J:
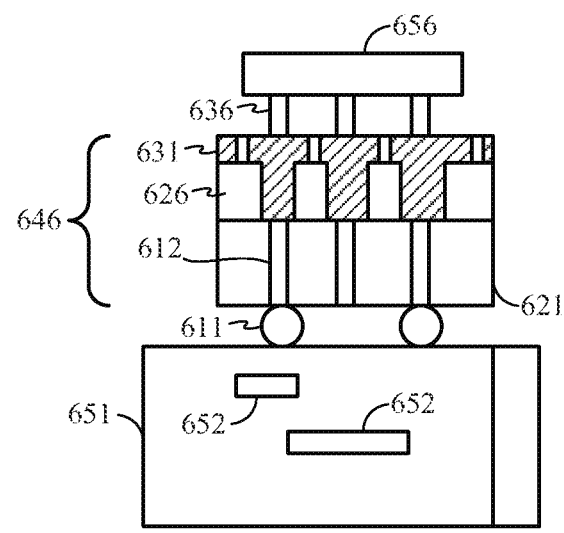
Figure 6K:
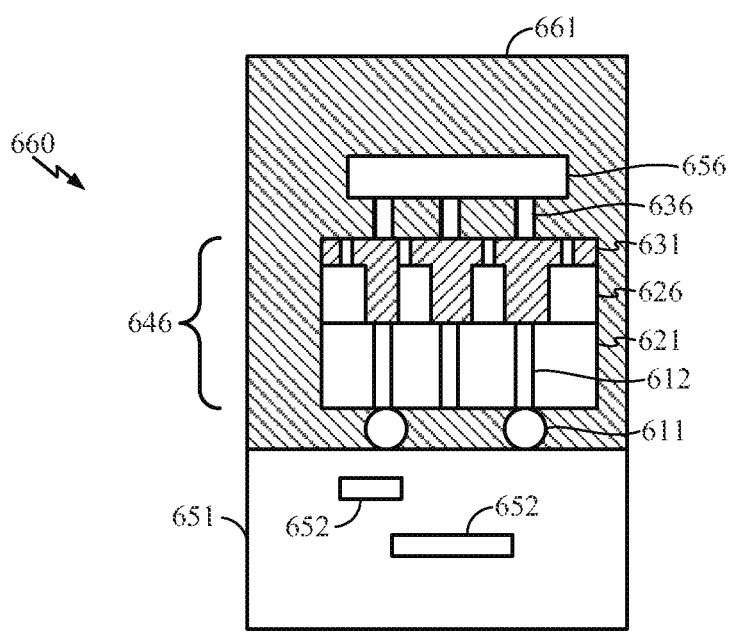

With reference to FIG. 6C, the wafer 610 is thinned to expose the through silicon vias 612. An isolation layer 626 is deposited on the wafer 610 in FIG. 6D. The isolation layer 626 is etched and a conducting layer 631 deposited in the etched regions of the isolation layer 626 in FIG. 6E. A packaging connection 636 is coupled to the conducting layer 631 in FIG. 6F. The carrier wafer 616 is detached in FIG. 6G. The wafer 610 is then diced into multiple dies such as a die 646 and a die 647 in FIG. 6H. Each of the dies 646, 647 is attached on a substrate panel 651 through the packaging connection 611 as shown in FIG. 6I. The substrate panel 651 may also contain interconnections 652. A second tier die 656 is attached on the die 646 and coupled through the packaging connection 636 in FIG. 6J. The second tier die 656 is a larger height than the die 646. Thus, when the second tier die 656 is attached on the die 646 there is a possibility of damaging the wafer 621 through high forces experienced by the wafer 621. After attachment of the second tier die 656 on the die 646 the second tier die 656 is encapsulated in a mold compound 661 in FIG. 6K.

Attaching a wafer to a substrate panel instead of a carrier wafer during manufacturing before the wafer is thinned provides mechanical support to prevent damage during handling or warpage of the wafer resulting from unbalanced stress. Unlike the carrier wafer, the substrate panel is a part of a product and will not be removed. Eliminating the carrier wafer and other unnecessary materials, such as adhesives and cleaning solutions from manufacturing reduces cost and complexity.

Figure 7:
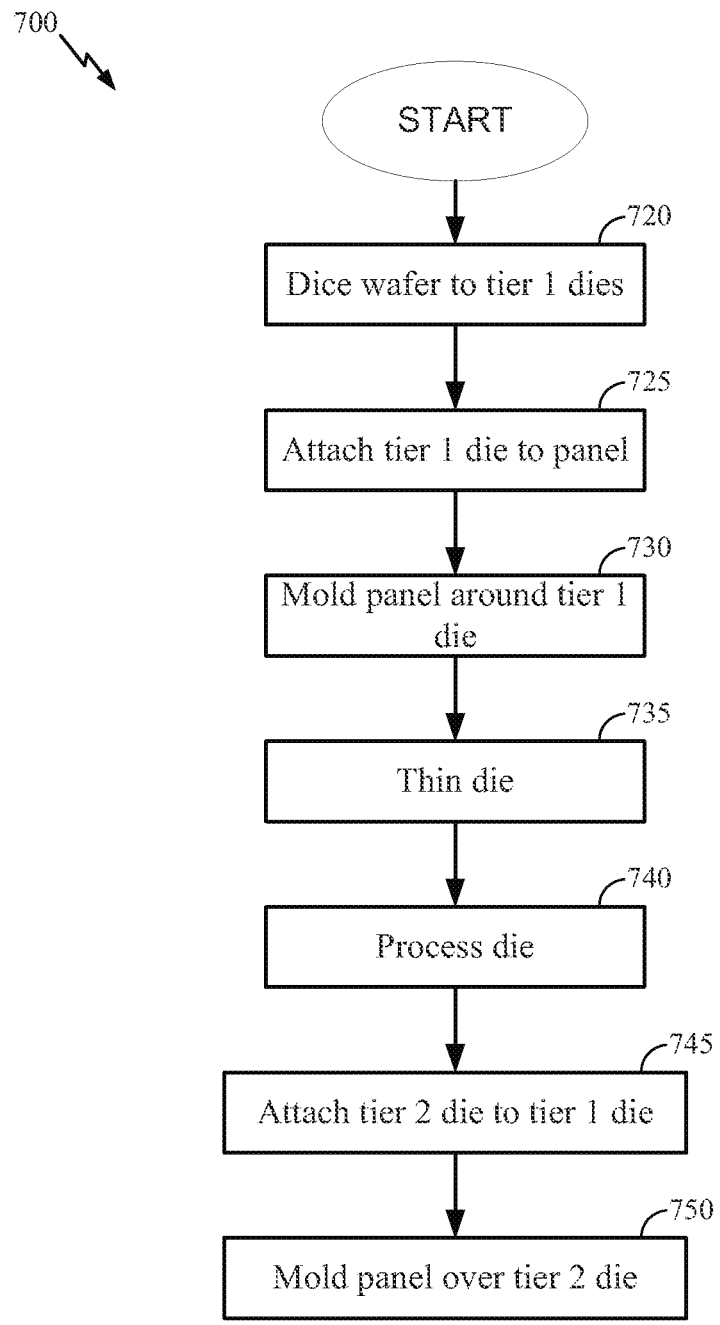
FIG. 7 is a flow chart illustrating an exemplary process for manufacturing an IC according to one embodiment.

FIG. 7 is a flow chart illustrating an exemplary process for manufacturing of an IC according to one embodiment. At block 720, the wafer is diced to form a first tier die. At block 725, the first tier die is attached to a substrate panel. The substrate panel provides support for semiconductor dies at a lower cost than producing semiconductor dies at large thicknesses used in final products. In one embodiment, the wafer is thinned before attaching the substrate panel. At block 730, the first tier die and substrate panel are encapsulated in a mold compound. The mold compound is applied to electronic parts and assemblies to provide support and protection. Mold compounds may be compounds containing epoxy resin, filler and additive. The filler and additive are added to adjust, for example, the thermal coefficient of expansion. At block 735, the first tier die is thinned. This may be to prepare the wafer for further processing. For example, in a stacked IC, thinning exposes at least one through silicon via. At block 740, additional manufacturing is completed on the first tier die including deposition of packaging connections.

If a single tier IC is desired, the manufacturing flow chart 700 may end after the block 740. Alternatively, additional manufacturing may be used to stack a second tier die or further dies on the first tier die as described below. The single tier ICs may or may not include through silicon vias.

At block 745, a second tier die is attached on the first tier die. At block 750, the second tier die, first tier die, and substrate panel are encapsulated in a mold compound. Details of a specific embodiment of the exemplary process of manufacturing stacked ICs will be presented below with reference to FIG. 8.

Figure 8:
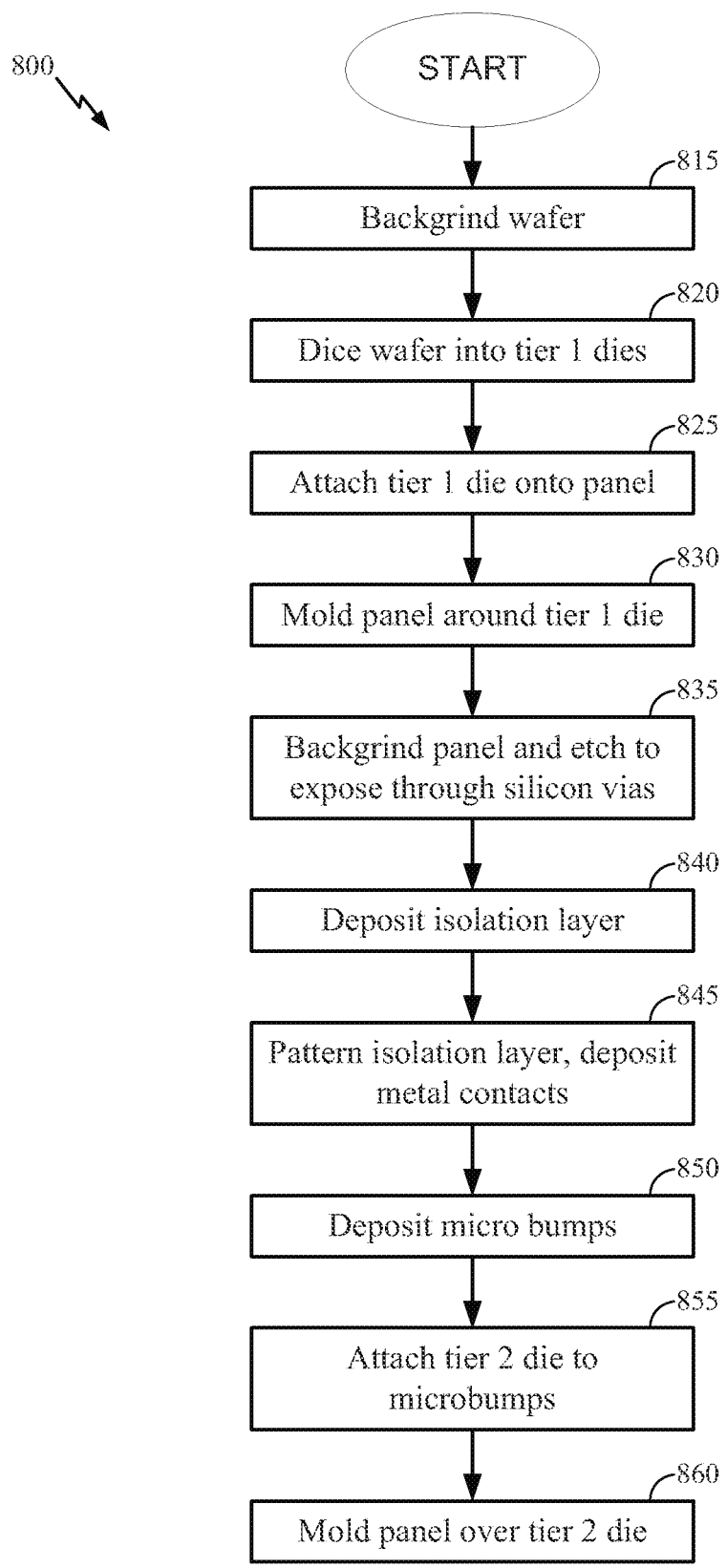
FIG. 8 is a flow chart illustrating an exemplary process for manufacturing a stacked IC according to one embodiment.

FIG. 8 is a flow chart illustrating exemplary manufacturing of a stacked IC according to one embodiment. At block 815, the wafer may be optionally thinned, for example, by backgrinding or etching. Thinning before attaching to the substrate panel aids in uniform backgrinding of the mold compound. According to one embodiment, the wafer is thinned to approximately 100 µm. Before stacked IC manufacturing the wafer may be 50-300 µm. At block 820, the wafer is diced into first tier dies. Dicing may be accomplished by, for example, scribing with a diamond scribe, sawing with a diamond saw, or cutting with a laser.

At block 825, the first tier dies are attached to a substrate panel. The substrate panel may be, for example, a fiber reinforced resin, an organic film, or a semiconductor. The substrate panel is a part of the final stacked IC product. Thus, the substrate panel provides support for the first tier dies without being removed later in manufacturing.

At block 830 the first tier dies and substrate panel are encapsulated in a mold compound. The mold compound provides additional support for the first tier die in addition to the support provided by the substrate panel. At block 835, further backgrinding thins the first tier die to expose a through silicon via. After further backgrinding, the first tier die may be, according to one embodiment, less than 50 µm in height. A silicon recess etch may be used to further thin the first tier die.

At block 840, an isolation layer is deposited on the first tier die. The isolation layer may be, for example, silicon nitride, silicon oxide, or a polymer. At block 845, the isolation layer is patterned and a conductive layer is deposited in the etched regions. Patterning of the isolation layer may be accomplished, for example, by depositing a photoresist material, exposing the photoresist through a mask in a photolithography tool, etching the isolation layer, and removing photoresist material. The metal layer deposited in the etched regions of the isolation layer may couple, for example, to through silicon vias in the first tier die. The conductive layer may be copper, aluminum, or alloys of copper, aluminum, and other elements.

At block 850, microbumps are deposited on the first tier die. Depositing of the microbumps may be accomplished, for example, by seeding, performing under bump metallurgy (UBM), patterning, and plating of metals. The microbumps may be used for coupling to a second tier die. At block 855, a second tier die is attached on the first tier die and coupled through the microbumps. The second tier die may be the same type of die as the first tier die or in one embodiment a complimentary die. For example, a memory device in the second tier die may compliment a logic unit in the first tier die. At block 860, the first tier die, second tier die, and substrate panel are encapsulated in a mold compound.

FIGS. 9A-9L are block diagrams illustrating an exemplary stacked IC manufacturing process according to one embodiment. A wafer 910 includes a packaging connection 911 and through silicon vias 912. In one example, the wafer 910 has a thickness of 50-300 µm. The wafer 910 is thinned through backgrinding to form a wafer 915 of FIG. 9B. In one example, the wafer 915 may be a thickness of 100 µm. The wafer 915 is diced to form a first tier die 921 and a first tier die 922 of FIG. 9C.

Figure 9A:
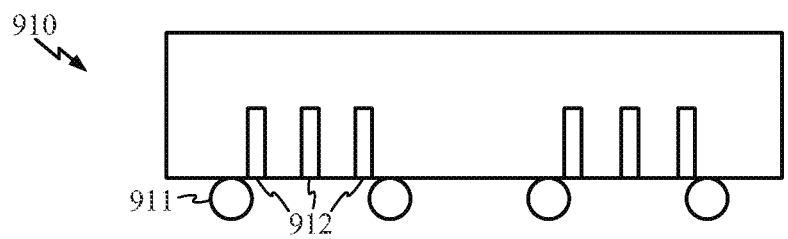
FIGS. 9A-9L are block diagrams illustrating an exemplary stacked IC manufacturing process according to one embodiment.
Figure 9B:
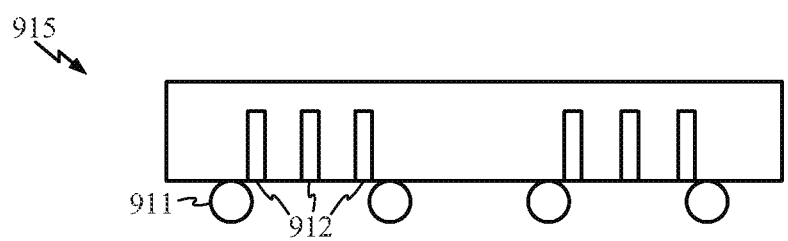
Figure 9C:
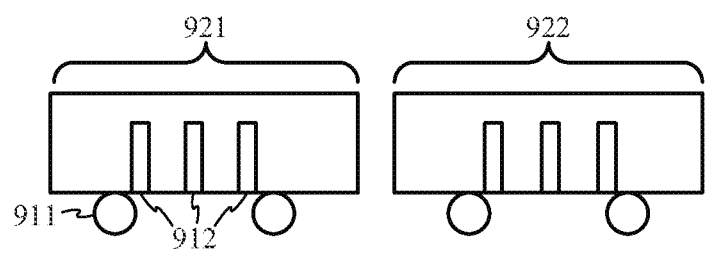
Figure 9D:
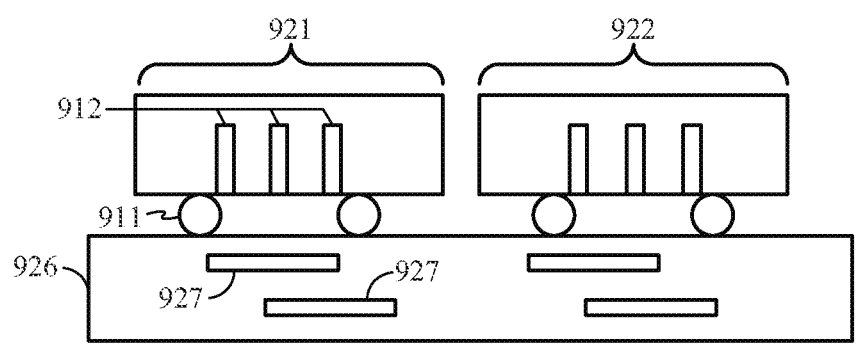

The first tier dies 921, 922 are attached to a substrate panel 926 having interconnects 927 in FIG. 9D. According to one embodiment, the substrate panel 926 may be, for example, a fiber reinforced, resin or an organic film. The substrate panel 926 provides support for semiconductor wafers at a lower cost than producing semiconductor wafers at large thicknesses used in final products.

Figure 9E:
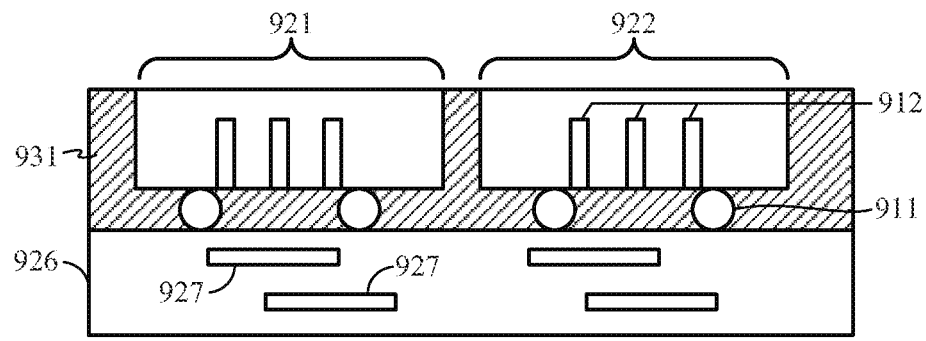

A mold compound 931 is placed around the first tier dies 921, 922 to fix the first tier dies 921, 922 on the substrate panel 926 in FIG. 9E. In one embodiment, the mold compound 931 is formed by placing mold compound in a chase and then depositing the mold compound around the first tier dies 921, 922. To reduce cost of manufacturing, a minimum amount of mold compound covers the first tier dies 921, 922. Extra mold compound applied to the first tier dies 921, 922 should be removed through backgrinding.

Figure 9F:
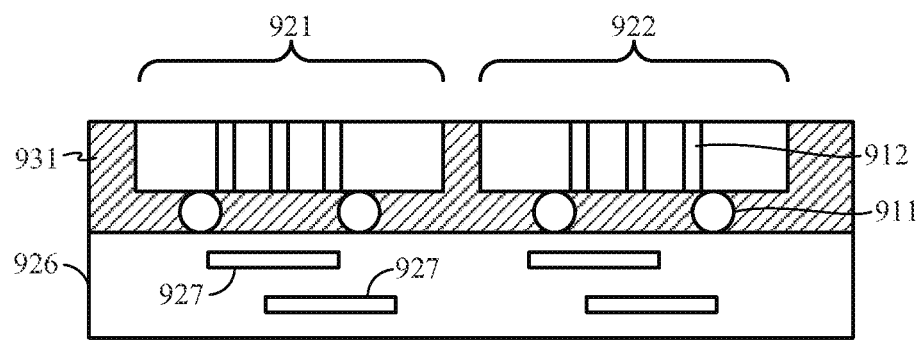
Figure 9G:
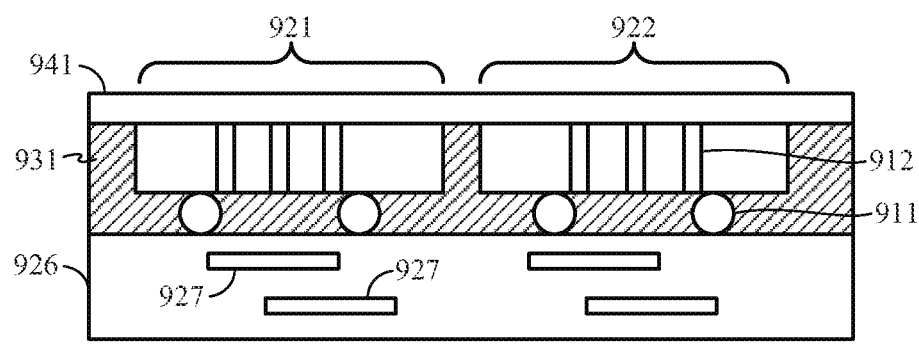
Figure 9H:
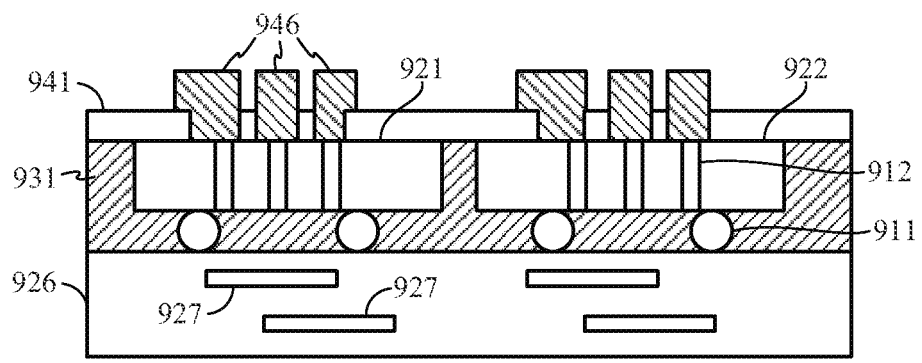

The first tier die 921, 922 and the mold compound 931 is thinned through backgrinding or recess etching to expose the through silicon vias 912 in FIG. 9F. In one example, the thickness is less than 50 µm. An isolation layer 941 is deposited on the first tier dies 921, 922 in FIG. 9G. The isolation layer 941 is patterned using lithography and etching, and metal connections 946 are deposited in etched regions in FIG. 9H. The isolation layer 941 and other back end of line (BEOL) layers (not shown) are co-planar with the substrate panel 926 as a result of applying the mold compound 931 before performing any BEOL processing.

Figure 9I:
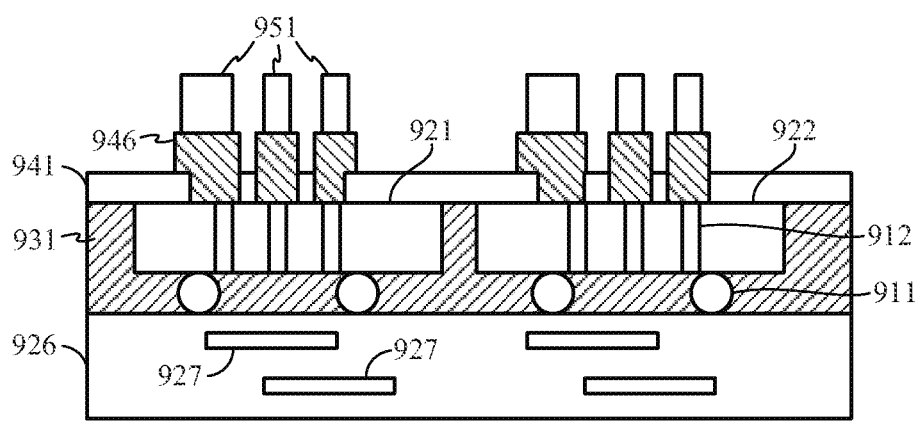
Figure 9J:
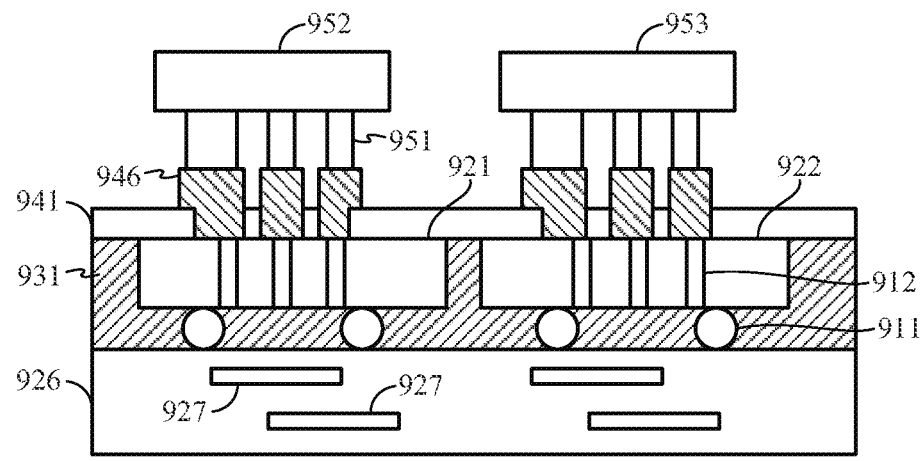
Figure 9K:
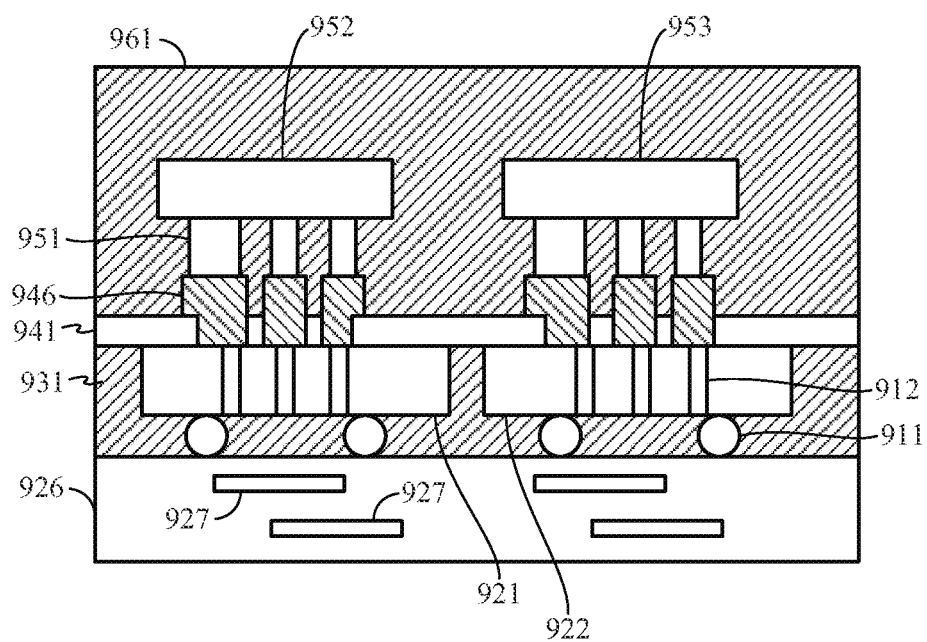

Microbumps 951 or other packaging connections are deposited in FIG. 9I. A second tier die 952 is attached on the first tier die 921, and a second tier die 953 is attached on the first tier die 922 in FIG. 9J. A mold compound 961 is placed on the second tier dies 952, 953 to fix the second tier dies 952, 953 in FIG. 9K.

Figure 9L:
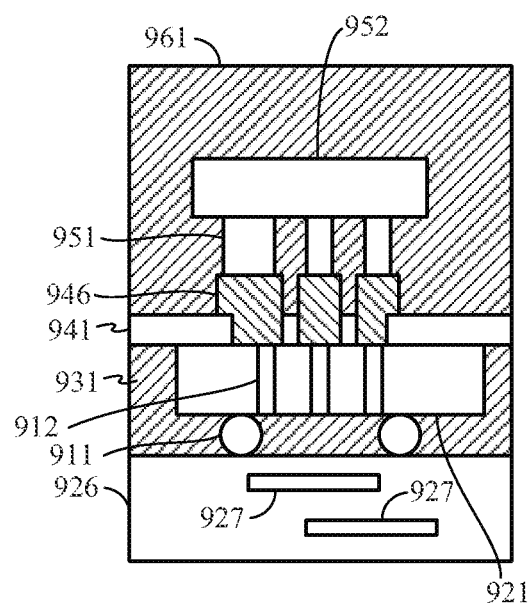

After the mold compound 961 is set, the second tier dies 952, 953 may be singulated into individual stacked ICs. FIG. 9L is a block diagram illustrating a stacked IC singulated from a wafer.

The figures described above illustrate several processes and are not necessarily drawn to scale. The processes described above may be applied to the manufacture of any size device.

The exemplary manufacturing of dies utilizing a substrate panel as support for a wafer during manufacturing reduces thin wafer warpage and handling risks. The exemplary manufacturing also eliminates use of carrier wafers and associated adhesives used to attach the carrier wafers. The manufacturing further reduces risks associated with attachment of a second tier or additional tiers associated with attaching a thick die on a thin die. The exemplary manufacturing process may be applied to stacked ICs. As described above, the manufacturing process leverages existing manufacturing techniques allowing easy transition from 2D ICs to 3D ICs.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor manufacturing method, the method comprising:
    attaching a first die to a substrate;
    applying a mold compound, after attaching the first die to the substrate, to the first die and the substrate;
    thinning the first die and the mold compound after applying the mold compound, in which the thinning exposes at least one through via;
    after thinning, depositing an isolation layer on the first die;
    patterning interconnects in the isolation layer; and
    depositing a packaging connection on the first die.

2. The method of claim 1, further comprising thinning the first die before attaching the first die to the substrate.

3. The method of claim 1, further comprises coupling the packaging connection to the at least one through via in the first die.

4. The method of claim 3, further comprising attaching a second die to the packaging connection.

5. The method of claim 4, further comprising applying a second mold compound to the second die.

6. The method of claim 1, further comprising dicing a wafer into the first die before attaching the first die to the substrate.

7. The method of claim 1, in which applying the first mold compound comprises applying an epoxy-based mold.

8. The method of claim 1, in which applying the first mold compound includes filling a mold chase with mold compound and applying the mold chase to the first die.

9. The method of claim 1, further comprising incorporating the first die into at least one of a music player, a video player, an entertainment unit, a navigation device, a communications device, a personal digital assistant (PDA), a fixed location data unit, and a computer.

10. A semiconductor manufacturing method, the method comprising:
    dicing a wafer into a first tier die;
    attaching the first tier die to a substrate;
    applying a first mold compound to the first tier die and the substrate;
    backgrinding the first tier die and the first mold compound;
    attaching a second tier die to the first tier die; and
    applying a second mold compound to the first tier die and the second tier die.

11. The method of claim 10, further comprising backgrinding the wafer before dicing the wafer.

12. The method of claim 10, in which backgrinding the first tier die exposes at least one through via.

13. The method of claim 12, further comprising after backgrinding:
    depositing an isolation layer on the first tier die;
    patterning interconnects in the isolation layer; and
    depositing a packaging connection on the first tier die.

14. The method of claim 13, further comprises coupling the packaging connection to the at least one through via in the first tier die.

15. The method of claim 10 in which applying the first and the second mold compounds comprises applying an epoxy-based mold.

16. The method of claim 10, in which applying the first and the second mold compounds include filling a mold chase with mold compound and applying the mold chase to the first and second tier dies.

17. The method of claim 10, further comprising incorporating the first tier die and the second tier die into at least one of a music player, a video player, an entertainment unit, a navigation device, a communications device, a personal digital assistant (PDA), a fixed location data unit, and a computer.

* * * * *